(12) United States Patent
Yonekura et al.

(10) Patent No.: US 8,023,248 B2
(45) Date of Patent: Sep. 20, 2011

(54) ELECTROSTATIC CHUCK

(75) Inventors: Hiroshi Yonekura, Nagano (JP); Koki Tamagawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 3 days.

(21) Appl. No.: 12/714,654

(22) Filed: Mar. 1, 2010

(65) Prior Publication Data
US 2010/0220425 A1 Sep. 2, 2010

(30) Foreign Application Priority Data

Mar. 2, 2009 (JP) ................. 2009-047767

(51) Int. Cl.
*H01L 21/683* (2006.01)
*H01T 23/00* (2006.01)

(52) U.S. Cl. ...................................... 361/234

(58) Field of Classification Search .................. 361/234
See application file for complete search history.

(56) References Cited

U.S. PATENT DOCUMENTS

| 5,753,132 | A * | 5/1998 | Shamouilian et al. | 216/33 |
| 5,777,838 | A * | 7/1998 | Tamagawa et al. | 361/234 |
| 7,187,433 | B2 * | 3/2007 | Ottens et al. | 355/72 |
| 7,586,734 | B2 * | 9/2009 | Kamitani et al. | 361/234 |

FOREIGN PATENT DOCUMENTS

JP 2003-086664 3/2003

* cited by examiner

*Primary Examiner* — Dharti Patel
(74) *Attorney, Agent, or Firm* — Rankin, Hill & Clark LLP

(57) ABSTRACT

An electrostatic chuck includes a dielectric layer 30 formed with an attraction and fix face onto which a plate member 10 is attracted and fixed, wherein the attraction and fix face of the dielectric layer 30 is formed with a plurality of projection parts 32 each with only a tip face abutting the plate member 10 formed as a flat face by grinding and formed with a coolant gas flow path 36 where a coolant gas flows is opened to the flat face of each of the projection parts 32.

6 Claims, 3 Drawing Sheets

ELECTROSTATIC CHUCK

CROSS-REFERENCE TO RELATED APPLICATION

This application is based on and claims priority under 35 U.S.C. §119 from Japanese Patent Application No. 2009-047767 filed on Mar. 2, 2009.

BACKGROUND OF THE INVENTION

1. Technical Field

This invention relates to an electrostatic chuck.

2. Related Arts

Patent Document 1 proposes an electrostatic chuck shown in FIG. 5 as an electrostatic chuck for attracting and fixing a plate member of a wafer, etc.

The electrostatic chuck shown in FIG. 5 is formed with a plurality of projection parts 102, 102, . . . each having a flat tip face, formed on an attraction and fix face of a dielectric layer 100, and an exit of a coolant gas flow path 104 is opened in a valley part formed between the projection parts 102 and 102.

Further, in the electrostatic chuck shown in FIG. 5, the full face of the attraction and fix face containing the tip end faces, side faces, and valley part faces of the projection parts 102 is ground.

[Patent Document 1] Japanese Patent Laid-Open No. 2003-86664

In the electrostatic chuck shown in FIG. 5, when a plate member 106 is attracted and fixed onto the attraction and fix face of the dielectric layer 100, the plate member 106 and the dielectric layer 100 are in contact with each other on the flat faces formed on the tip faces, and helium as a coolant gas passing through the coolant gas flow path 104 flows out into the valley between the projection parts 102. Thus, heat added to the plate member 106 attracted and fixed onto the attraction and fix face of the dielectric layer 100 can be radiated rapidly.

Further, the full face of the attraction and fix face of the electrostatic chuck is ground and thus when the plate member 106 is attracted and fixed, scattering of particles from the attraction and fix face of the electrostatic chuck can be prevented.

In the electrostatic chuck shown in FIG. 5, however, the full face of the attraction and fix face containing the projection parts 102 of the dielectric layer 100 is ground and thus the manufacturing process of the electrostatic chuck is complicated.

Further, it turned out that the boundary part between the tip face and a side face of the projection parts 102 of the dielectric layer 100 becomes round and the contact area between each tip face and the plate member 106 becomes lower than the design value. It is difficult to predict lowering of the contact area caused by grinding.

By the way, the contact area between the tip face of each of the projection parts 102 and the plate member 106 is important for striking a balance between the attraction force of the plate member 106 and heat removal of the plate member 106 and it is necessary that the contact area does not substantially change before and after grinding.

On the other hand, the grinding is necessary for preventing minute projections of each tip face from scattering as particles when the plate member 106 and the tip faces of the projection parts 102 come in contact with each other.

SUMMARY OF THE INVENTION

It is therefore an object of the invention to solve the problem of the conventional electrostatic chuck in that the contact area of the plate member coming in contact with the tip face of each projection part changes before and after grinding performed for the tip faces and the side faces of the projection parts formed on the attraction and fix face of the dielectric layer and provide an electrostatic chuck wherein the contact area of a plate member coming in contact with the tip face of each projection part formed on an attraction and fix face of a dielectric layer does not change before and after grinding.

As a result of discussion to solve the problem described above, the inventor et al. found out that only the tip faces of projection parts formed on an attraction and fix face of a dielectric layer are ground, whereby scattering of particles caused by contact with a plate member can be prevented and the contact area of the plate member coming in contact with the tip face of each projection part does not change before and after grinding and that a coolant gas flow path where a coolant gas flows is opened to the tip face of each projection part, whereby heat of the plate member can be removed rapidly, and has reached the invention.

That is, according to a first aspect of the invention, there is provided an electrostatic chuck including:

a dielectric layer formed with an attraction and fix face onto which a plate member is attracted and fixed, and an internal electrode formed in the dielectric layer, wherein the attraction and fix face of the dielectric layer is formed with a plurality of projection parts each with only a tip face abutting the plate member formed as a flat face by grinding and formed with a coolant gas flow path where a coolant gas flows is opened to the flat face of each of the projection parts.

According to a second of the invention, there is provided the electrostatic chuck as in the first aspect, wherein roughness (Ra) of the flat face of each of the projection parts is set to 0.2 to 0.3.

According to a third aspect of the invention, there is provided the electrostatic chuck as in the first or second aspect, wherein a valley part between the projection parts is formed by sandblast.

According to a fourth aspect of the invention, there is provided the electrostatic chuck as in any one of the first to third aspects, wherein the height of the projection part is set to 10 to 30 μm and the maximum diameter is set to 1 to 2 mm.

According to a fifth aspect of the invention, there is provided the electrostatic chuck as in any one of the first to fourth aspects, wherein the tip face of a peripheral wall of the same height as the projection part, formed along the periphery of the dielectric layer is ground to be formed as a flat face, so that the flat face can come in contact with the plate member for preventing leakage of the coolant gas flowing out between the dielectric layer and the attraction member.

In the electrostatic chuck according to the invention, only the tip faces of the projection parts formed on the attraction and fix face of the dielectric layer are ground. Thus, the contact area of each tip face coming in contact with the plate member can be prevented from being different from the design value because of grinding. Thus, if the valley part between the projection parts is not ground, the tip faces of the projection parts coming in contact with the plate member are ground, so that minute projections of each tip face can be prevented from scattering as particles when coming in contact with the plate member.

Since grinding performed for the tip faces of the projection parts is easy as compared with grinding of the side face of the projection part, so that the manufacturing process of the electrostatic chuck can be simplified.

Further, the coolant gas flow path where a coolant gas flows is opened to the tip face of each of the projection parts, so that the heat added to the plate member can be removed rapidly with the coolant gas flowing out from the coolant gas flow path and working can be performed on the plate member with a predetermined attraction force maintained.

Consequently, according to the electrostatic chuck according to the invention, the manufacturing cost of the electrostatic chuck can be reduced and precise working can be performed on the attracted and fixed plate member.

DETAILED DESCRIPTION OF THE PREFERRED EMBODIMENTS

Figure 1:
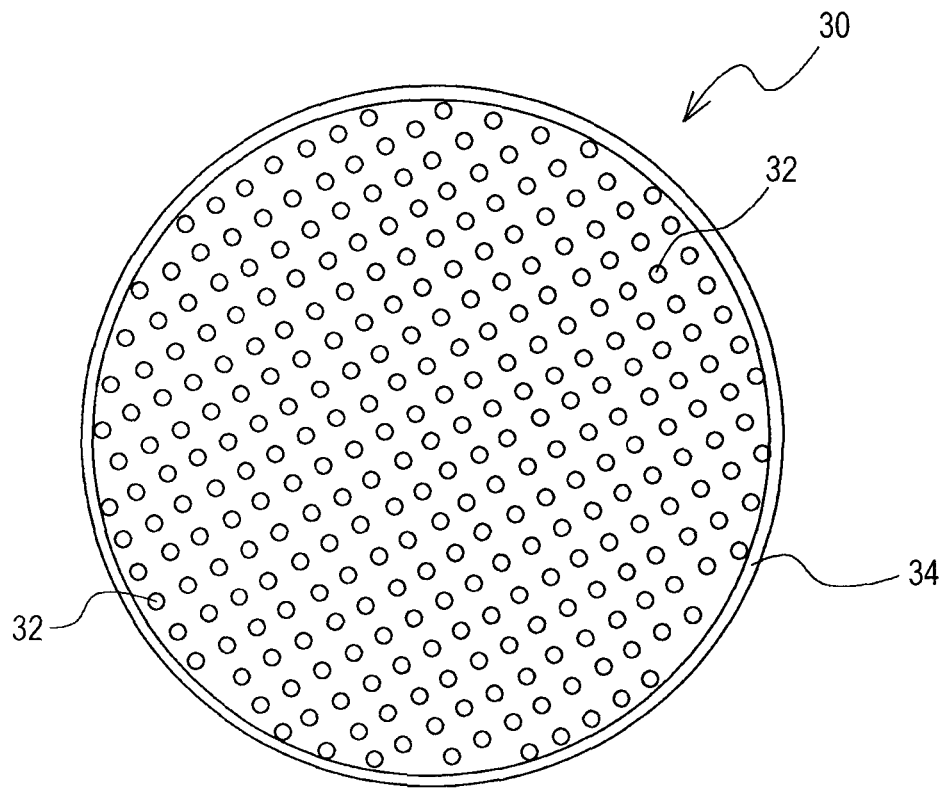
FIG. 1 is a front view to show an example of a dielectric layer used with an electrostatic chuck according to the invention.
Figure 2:
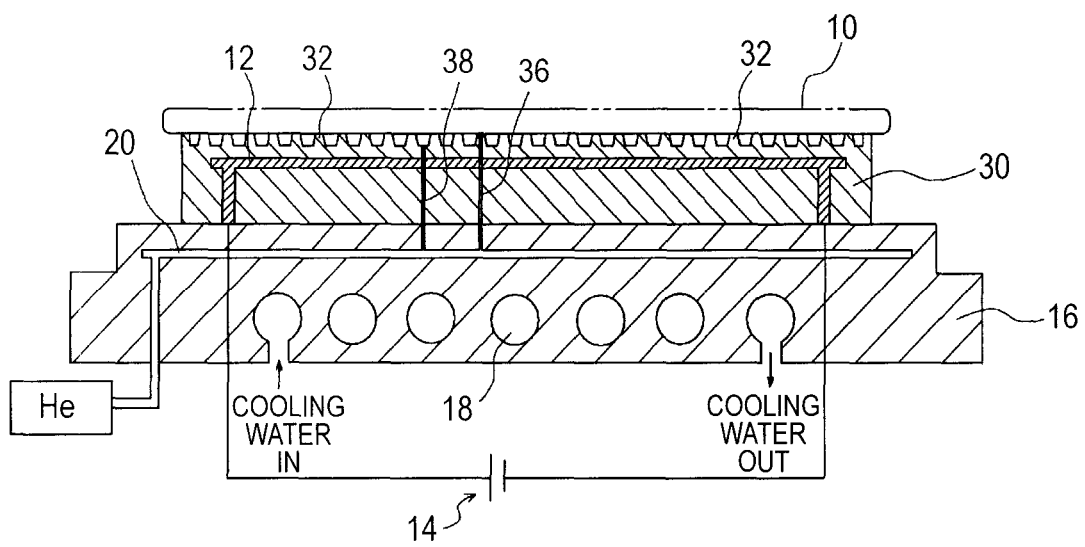
FIG. 2 is a schematic sectional view to describe an example of the electrostatic chuck using the dielectric layer shown in FIG. 1.

FIGS. 1 and 2 show an example of an electrostatic chuck according to the invention. A circular dielectric layer 30 to form the electrostatic chuck shown in FIG. 1 is formed of alumina. A large number of projection parts 32, 32, . . . formed on the attraction and fix face of the dielectric layer 30 are surrounded by a peripheral wall 34 with a tip face as a flat face along the periphery of the dielectric layer 30.

Further, as shown in FIG. 2, an internal electrode 12 connected to a DC power supply 14 is formed in the dielectric layer 30 shown in FIG. 1. The dielectric layer 30 is placed on a base plate 16.

Formed in the base plate 16 are a cooling water pipe line 18 for introducing cooling water and a coolant gas introduction path 20 into which helium as a coolant gas in a portion near to the dielectric layer 30.

A coolant gas flow, path 36 opened to the tip face of each of the projection parts 32, 32, . . . formed on the attraction and fix face of the dielectric layer 30 and a coolant gas flow path 38 opened to the valley part between the projection parts 32 branch from the coolant gas introduction path 20.

The cooling water pipe line 18 and the coolant gas flow paths 36 and 38 are provided for rapidly removing heat added to a plate member 10, the dielectric layer 30, and the base plate 16 and maintaining the attraction force while maintaining a state in which the plate member 10 is attracted onto the attraction and fix face of the dielectric layer 30.

Figure 3:
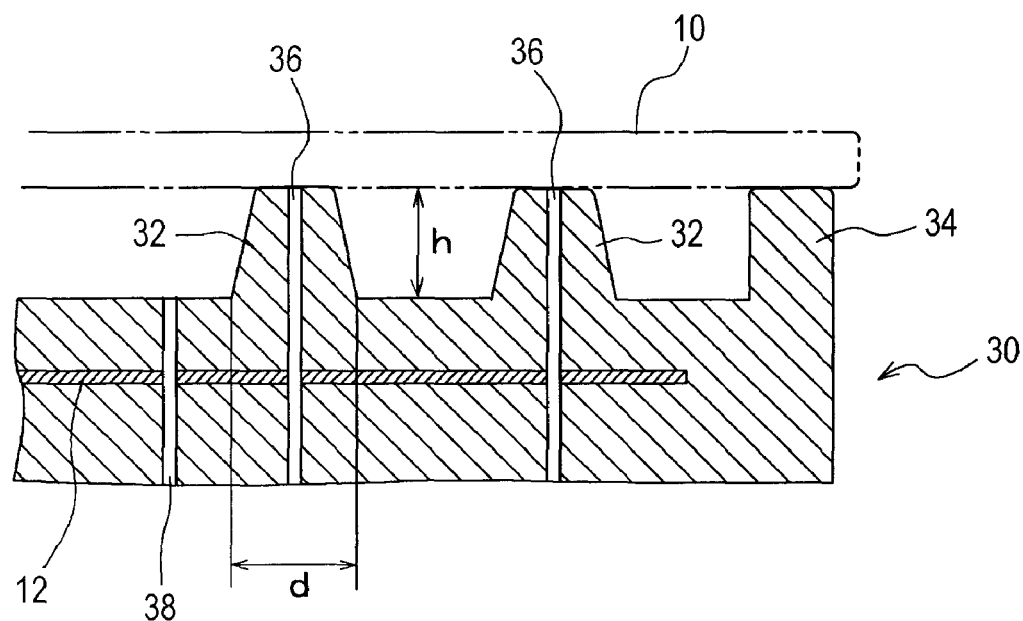
FIG. 3 is a fragmentary sectional view of the dielectric layer shown in FIG. 1.

The projection parts 32, 32, . . . are formed on the attraction and fix face of the dielectric layer 30 as shown in FIG. 3 (enlarged fragmentary sectional view). The projection part 32 is shaped like a circular truncated cone on a transverse sectional view and has a height (h) of 10 to 30 μm and the maximum diameter (d) 1 to 2 mm.

The coolant gas flow path 36 having a diameter of 0.5 mm where helium as a coolant gas flows is opened to the tip face of each of the projection parts 32, and the coolant gas flow path 38 where helium as a coolant gas flows is also opened to the flat face of the valley part between the projection parts 32.

Figure 4:
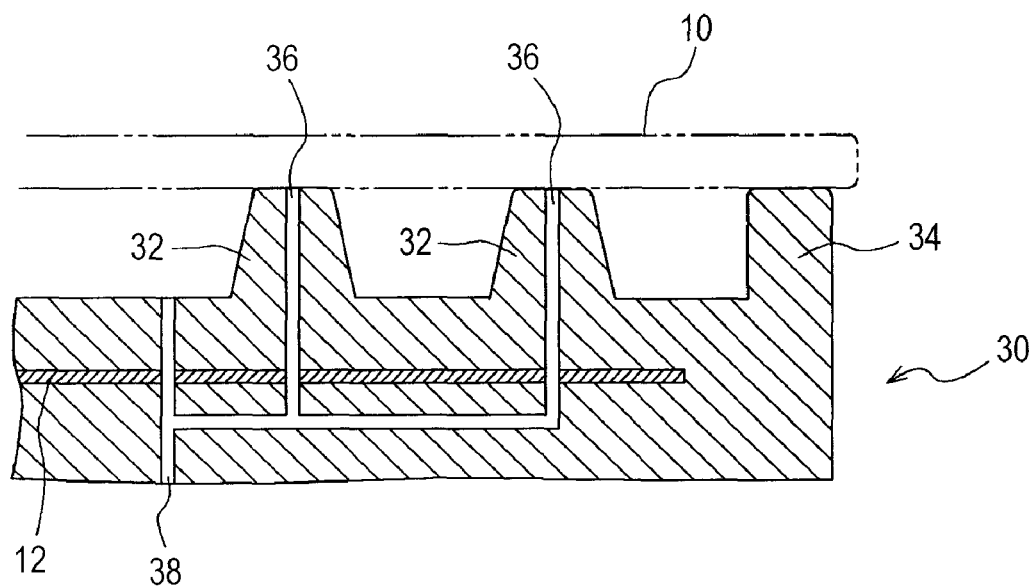
FIG. 4 is a fragmentary sectional view to show another example of dielectric layer.

The flow paths 36 and 38 are connected to the coolant gas introduction path 20 shown in FIG. 4.

Further, the tip face of the peripheral wall 34 formed along the periphery of the dielectric layer 30 so as to surround the projection parts 32 has the same height as the projection part 32.

The tip faces of the projection parts 32 and the peripheral wall 34 are ground and are formed like smooth surfaces and each has roughness (Ra) of 0.2 to 0.3.

On the other hand, the side faces of the projection parts 32 and the valleys each formed between the projection parts 32, formed on the attraction and fix face of the dielectric layer 30 shown in FIGS. 1 to 3 are not ground. Thus, the following can be prevented: The boundary part between the tip face and the side face of each of the projection parts 32 becomes round because of grinding and the contact face of each of the projection parts 32 for coming in contact with the plate member 10 varies before and after grinding.

Thus, if the side faces of the projection parts 32 and the valleys each between the projection parts 32 are not ground, the tip faces of the projection parts 32 with which the plate member 10 comes in contact and the tip faces of the peripheral wall 34 are ground and thus scattering of particles caused by contact with the plate member 10 can be prevented.

To produce the electrostatic chuck shown in FIGS. 1 to 3, first a mask plate where the surfaces of other portions than the portions to form the projection parts 32 and the peripheral wall 34 are exposed is put on one face side of the dielectric layer shaped like a plate wherein the internal electrode 12 is formed, and the exposure portion is cut away by sandblast.

Next, the mask plate is removed and only the tip faces of the projection parts 32 and the peripheral wall 34 are ground and then the coolant gas flow paths 36 and 38 are formed, whereby the dielectric layer 30 shown in FIGS. 1 to 3 can be provided.

Figure 5:
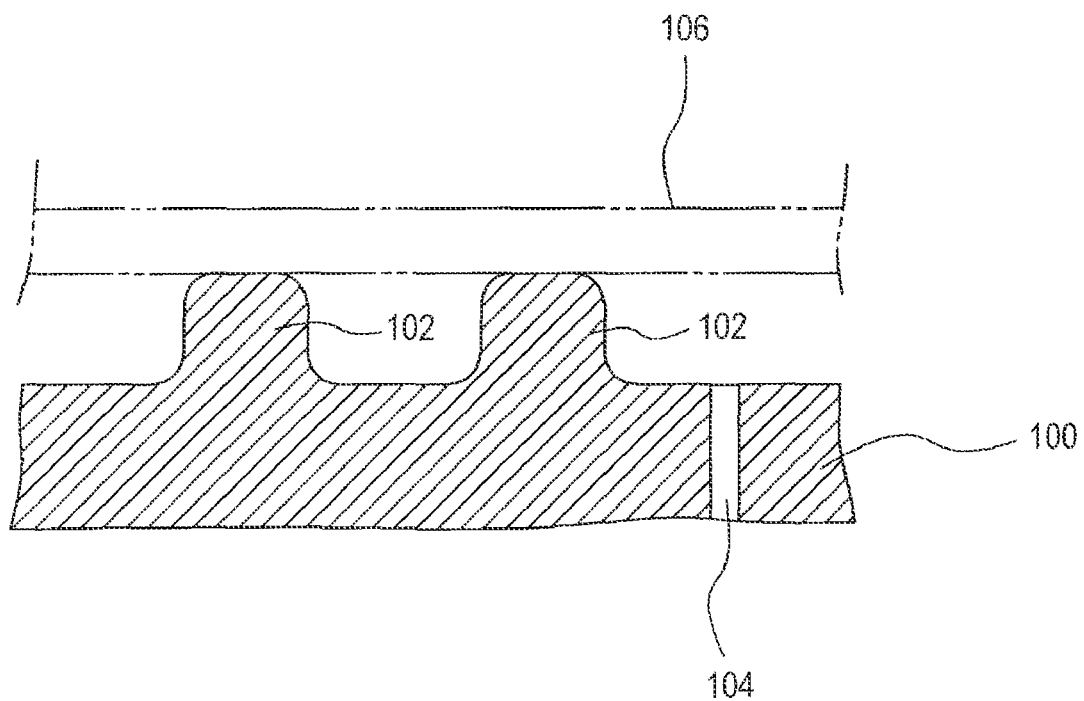
FIG. 5 is a schematic sectional view to describe a dielectric layer using an electrostatic chuck in a related art.

Thus, only the tip faces of the projection parts 32 and the peripheral wall 34 are ground and the dielectric layer 30 can be provided; the dielectric layer 30 can be provided easily as compared with the case where the full face of the attraction and fix face of the dielectric layer 100 is ground like the dielectric layer 100 shown in FIG. 5.

The provided dielectric layer 30 is placed on the base plate 16 as shown in FIG. 2, whereby the electrostatic chuck can be provided.

The full face of one face side of the dielectric layer shaped like a plate wherein the internal electrode 12 is formed is grounded and then a mask plate where the surfaces of other portions than the portions to form the projection parts 32 and the peripheral wall 34 are exposed is put and the exposure portion is cut away by sandblast, whereby the dielectric layer 30 shown in FIGS. 1 to 3 can also be provided.

The plate member 10 is placed on the attraction and fix face of the dielectric layer 30 forming the provided electrostatic chuck and a DC current is applied from the DC power supply 14 to the internal electrode 12, whereby the plate member 10 can be attracted and fixed onto the tip faces of the projection parts 32.

On the attraction and fix face of the dielectric layer 30, helium as a coolant gas can be brought into contact with the contract face of the plate member 10 in contact with the tip face of the projection part 32 via the coolant gas flow path 36. Further, helium as a coolant gas can also be brought into contact with the face of the plate member 10 covering the valley part between the projection parts 32 via the coolant gas flow path 38.

Thus, helium as a coolant gas can be brought into contact with the full face of the plate member 10 attracted and fixed onto the attraction and fix face of the dielectric layer 30 and the heat added to the plate member 10 can be removed rapidly.

The heat added to the dielectric layer 30 and the base plate 16 can also be removed rapidly with helium as a coolant gas in the coolant gas introduction path 20 and the coolant gas flow paths 36 and 38 formed the dielectric layer 30 and the base plate 16 and cooling water in the cooling water pipe line 18.

Thus, when heat is added to the plate member 10 attracted and fixed to the electrostatic chuck for working, the working can be performed with the attraction force maintained and consequently accurate working can be performed on the plate member 10.

Further, helium as a coolant gas supplied to the nips between the attraction and fix face of the dielectric layer 30 and the plate member 10 is prevented from leaking as the plate member 10 abuts the tip face of the peripheral wall 34 formed along the periphery of the dielectric layer 30. Thus, a decrease in helium as it is leaked can be prevented and roughly all amount of helium supplied to the nips between the attraction and fix face of the dielectric layer 30 and the plate member 10 can be collected.

The coolant gas flow path 38 opened to the valley part between the projection parts 32 need not be formed for each valley part and may be formed in more than one valley part.

Each of the coolant gas flow paths 36 and 38 shown in FIGS. 2 and 3 is branched directly from the coolant gas introduction path 20, but the coolant gas flow paths 36 may be branched from the coolant gas flow path 38 as shown in FIG. 4.

The projection part 32 shown in FIGS. 2 to 4 is shaped like a circular truncated cone on a transverse sectional view, but may be a projection part shaped like a cylindrical column.

Further, the valley part between the projection parts 32 is filled with the coolant gas flowing out from the coolant gas flow path 36 opened to the tip face of each of the projection parts 32 and thus the coolant gas flow path 38 opened to the valley part may be unformed.

What is claimed is:

1. An electrostatic chuck comprising:
a dielectric layer formed with an attraction and fix face onto which a plate member is attracted and fixed, and
an internal electrode formed in the dielectric layer,
wherein the attraction and fix face of the dielectric layer is formed with a plurality of projection parts each with only a tip face abutting the plate member formed as a flat face by grinding and formed with a coolant gas flow path where a coolant gas flows to the flat face of each of the projection parts.

2. The electrostatic chuck as in claim 1, wherein roughness (Ra) of the flat face of each of the projection parts is set to 0.2 to 0.3.

3. The electrostatic chuck as in claim 1, wherein a valley part between the projection parts is formed by sandblast.

4. The electrostatic chuck as in claim 1, wherein the height of the projection part is set to 10 to 30 μm and the maximum diameter is set to 1 to 2 mm.

5. The electrostatic chuck as in claim 1, wherein the tip face of a peripheral wall of the same height as the projection part, formed along the periphery of the dielectric layer is ground to be formed as a flat face, so that the flat face can come in contact with the plate member for preventing leakage of the coolant gas flowing out between the dielectric layer and the attraction member.

6. The electrostatic chuck as in claim 1, further comprising: a coolant gas flow path opened to a valley part between the projection parts.

\* \* \* \* \*